United States Patent
Niu et al.

(10) Patent No.: US 11,996,861 B2
(45) Date of Patent: May 28, 2024

(54) DECODING METHOD AND DECODING DEVICE

(71) Applicant: Beijing University of Posts and Telecommunications, Beijing (CN)

(72) Inventors: Kai Niu, Beijing (CN); Yuxin Han, Beijing (CN); Xuanyu Li, Beijing (CN)

(73) Assignee: Beijing University of Posts and Telecommunications, Beijing (CN)

( * ) Notice: Subject to any disclaimer, the term of this patent is extended or adjusted under 35 U.S.C. 154(b) by 45 days.

(21) Appl. No.: 18/152,330

(22) Filed: Jan. 10, 2023

(65) Prior Publication Data
US 2024/0097705 A1 Mar. 21, 2024

(30) Foreign Application Priority Data
Sep. 20, 2022 (CN) .......................... 202211146279.5

(51) Int. Cl.
*H03M 13/11* (2006.01)
(52) U.S. Cl.
CPC .... *H03M 13/1108* (2013.01); *H03M 13/1151* (2013.01); *H03M 13/1177* (2013.01)
(58) Field of Classification Search
None
See application file for complete search history.

(56) References Cited

U.S. PATENT DOCUMENTS

| | | | | |
|---|---|---|---|---|
| 2015/0006992 A1* | 1/2015 | Xiong | ................. | G06F 11/1004 714/755 |
| 2017/0149444 A1* | 5/2017 | Lin | ..................... | H03M 13/116 |

* cited by examiner

Primary Examiner — Guerrier Merant
(74) Attorney, Agent, or Firm — Westbridge IP LLC

(57) ABSTRACT

Disclosed are a decoding method and a decoding device. The decoding method includes: performing a permutation processing on a receiving sequence and a generator matrix to obtain a permuted receiving sequence and an intermediate generator matrix according to a reliability of each bit of the receiving sequence; performing a Gaussian elimination processing on the intermediate generator matrix to obtain a systematic generator matrix generator matrix; performing a hard-decision decoding on the permuted receiving sequence to obtain a hard-decision decoding sequence; in response to determining a preset decoding end condition is not achieved, selecting a target error pattern from an error pattern set; and generating a decoding result based on the target error pattern, the hard-decision decoding sequence, and the systematic generator matrix. The decoding method can ensure the decoding performance and reduce the decoding complexity.

19 Claims, 4 Drawing Sheets

DECODING METHOD AND DECODING DEVICE

CROSS-REFERENCE TO RELATED APPLICATIONS

The application claims priority to Chinese Patent Application No. 202211146279.5, filed on Sep. 20, 2022, the entire contents of which are incorporated herein by reference.

TECHNICAL FIELD

The present disclosure relates to communication technologies, and in particular, to a decoding method and a decoding device.

BACKGROUND

The $3^{rd}$ generation partnership project (3GPP) has defined ultra-reliable low-latency communication (URLLC) as a key communication scenario of 5G networks, 6G networks and the above. Moreover, URLLC requires a decoding algorithm to have both high performance and low complexity. Ordered statistic decoding (OSD) is provided as a universal candidate decoding algorithm for the URLLC. The traditional OSD algorithm can provide a maximum likelihood (ML) decoding performance, but the complexity of which is high.

SUMMARY

Some examples of the present disclosure provide a decoding method and a decoding device which can improve the decoding performance with a low complexity.

The decoding method according to examples of the present disclosure includes: performing a permutation processing on a receiving sequence and a generator matrix to obtain a permuted receiving sequence and an intermediate generator matrix according to a reliability of each bit of the receiving sequence; performing a Gaussian elimination processing on the intermediate generator matrix to obtain a systematic generator matrix; performing a hard-decision decoding on the permuted receiving sequence to obtain a hard-decision decoding sequence; and in response to determining a preset decoding end condition is not achieved, selecting a target error pattern from an error pattern set, and generating a decoding result based on the target error pattern, the hard-decision decoding sequence, and the systematic generator matrix.

On the basis of the same inventive concept, the present disclosure also provides an electronic device, comprising a memory, a processor, and a computer program stored in the memory and executable on the processor, wherein the processor executes the computer program to implement the decoding method.

The present disclosure also provides a non-transitory computer-readable storage medium, wherein the non-transitory computer-readable storage medium stores computer instructions, and the computer instructions being used to make a computer execute the decoding method.

It can be seen from the above method and device provided by one or more examples of the present disclosure, a permutation processing is performed on a receiving sequence and a generator matrix to obtain a permuted receiving sequence and an intermediate generator matrix according to a reliability of each bit of the receiving sequence. Then, a Gaussian elimination processing is performed on the intermediate generator matrix to obtain a systematic generator matrix generator matrix. Further, a hard-decision decoding is performed on the permuted receiving sequence to obtain the hard-decision decoding sequence. If the preset decoding end condition is not achieved, a target error pattern is selected from the error pattern set, and the decoding result is generated based on the target error pattern, the hard-decision decoding sequence, and the systematic generator matrix. The decoding method of the embodiment can ensure the decoding performance with a low decoding complexity.

BRIEF DESCRIPTION OF THE DRAWINGS

In order to describe the technical solutions in one or more examples of the present disclosure or the prior art more clearly, the following briefly introduces accompanying drawings for describing the examples or the prior art. Apparently, the accompanying drawings in the following description show only the examples of the present disclosure, and those of ordinary skill in the art may still derive other drawings from these drawings without any creative efforts.

DETAILED DESCRIPTION OF THE EMBODIMENTS

Figure 1:
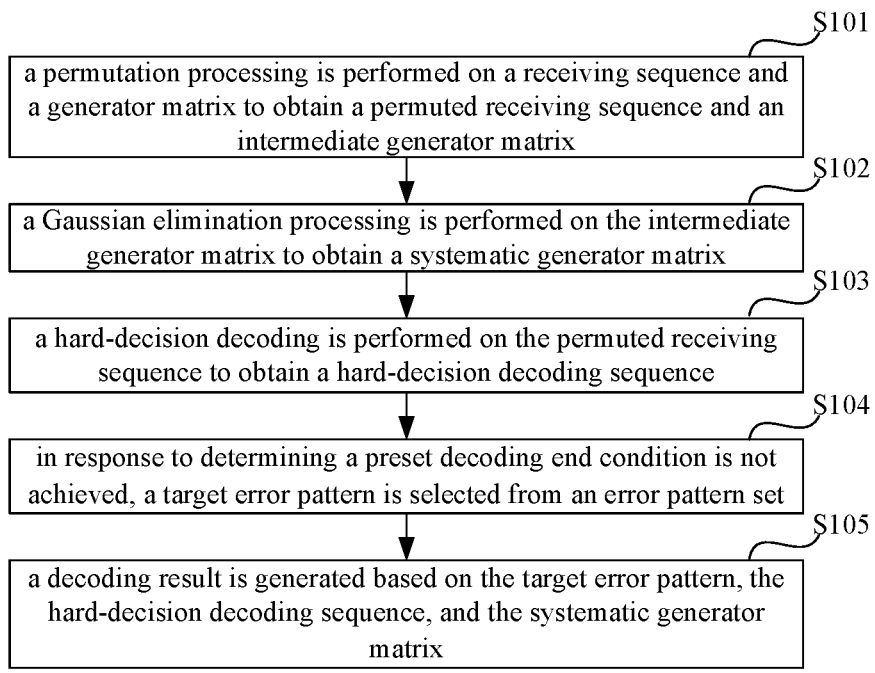
FIG. 1 is a schematic flowchart of a decoding method according to some examples of the present disclosure.

To make the objectives, technical solutions and advantages of the present disclosure clearer, the present disclosure will be further described in detail below in conjunction with specific examples and with reference to the accompanying drawings.

It should be noted that, unless otherwise defined, technical terms or scientific terms used in one or more embodiments of the specification should have the ordinary meanings as understood by those of ordinary skill in the art to which the present disclosure belongs. The terms "first", "second" and similar words used in one or more embodiments of the specification do not denote any order, quantity, or importance, but are merely used to distinguish different components. The terms "including" or "comprising" and the like are intended to indicate that elements or objects in front of the word encompass elements or objects listed after the word and their equivalents, but do not exclude another element or object. Similar terms such as "connected" or "linked" are not limited to physical or mechanical connections, but may include electrical connections, whether direct or indirect. The terms "upper", "lower", "left", "right" and the like are only used to represent a relative positional relationship, and when an absolute position of a described object changes, the relative positional relationship may also change accordingly.

As described in the background, the OSD decoding algorithm can perform a decoding on any linear block codes as a candidate universal decoding algorithm of URLLC. The OSD decoding algorithm performs a permutation on a receiving sequence based on a reliability measure at first. Then a hard-decision decoding is performed on a permutated receiving sequence and a decoding codeword obtained from the hard-decision decoding is reprocessed until a maximum likelihood performance is achieved. For a code with a length less than 64, the complexity of the OSD decoding algorithm is relatively low. However, under a URLLC communication scenario, a short code may not guarantee the communication reliability. Further, when the code rate increases, the complexity of the OSD decoding algorithm may increase accordingly. Therefore, under the URLLC communication scenario, how to ensure the communication performance while reducing the decoding complexity is an urgent problem needs to be solved.

In view of the above, some examples of the present disclosure provide a decoding method. In the decoding method, a permutation processing is performed on a receiving sequence and a generator matrix to obtain a permuted receiving sequence and an intermediate generator matrix according to a reliability of each bit of the receiving sequence at first. Then, a Gaussian elimination processing is performed on the intermediate generator matrix to obtain a systematic generator matrix generator matrix. At last, a decoding process with a maximum number of times of decoding is performed. During the whole decoding process, target error patterns are selected in an orderly manner, and a decoding is performed based on a target error pattern, the hard-decision decoding sequence, and the systematic generator matrix to obtain a decoding result. The decoding method can not only ensure the decoding performance, but also reduce the complexity of the decoding process. Moreover, the decoding method is suitable for decoding not only short codes, medium-length codes but also long codes.

Technical solutions of the present disclosure would be explained in detail by means of specific examples.

FIG. 1 is a schematic flowchart of a decoding method according to some examples of the present disclosure. As shown FIG. 1, the method may include the following steps.

In step S101, a permutation processing is performed on a receiving sequence and a generator matrix to obtain a permuted receiving sequence and an intermediate generator matrix according to a reliability of each bit of the receiving sequence.

In step S102, performing a Gaussian elimination processing on the intermediate generator matrix to obtain a systematic generator matrix.

In step S103, a hard-decision decoding is performed on the permuted receiving sequence to obtain a hard-decision decoding sequence.

In step S104, in response to determining a preset decoding end condition is not achieved, a target error pattern is selected from an error pattern set.

In step S105, a decoding result is generated based on the target error pattern, the hard-decision decoding sequence, and the systematic generator matrix.

It can be seen from the above method, a permutation processing is performed on a receiving sequence and a generator matrix to obtain a permuted receiving sequence and an intermediate generator matrix according to a reliability of each bit of the receiving sequence. Then, a hard-decision decoding is performed on the permuted receiving sequence according to the systematic generator matrix to obtain a hard-decision decoding sequence. Then a decoding process is performed. While decoding, a target error pattern is first selected from an error pattern set, and a decoding result is generated based on the target error pattern, the hard-decision decoding sequence, and the systematic generator matrix. Once the preset decoding end condition is achieved, a final decoding result can be obtained.

By selecting the target error patterns in an orderly manner, a correct code sequence would be found quickly. In this way, the efficiency of the decoding process would be improved and the decoding performance can be guaranteed with a low decoding complexity.

Figure 2:
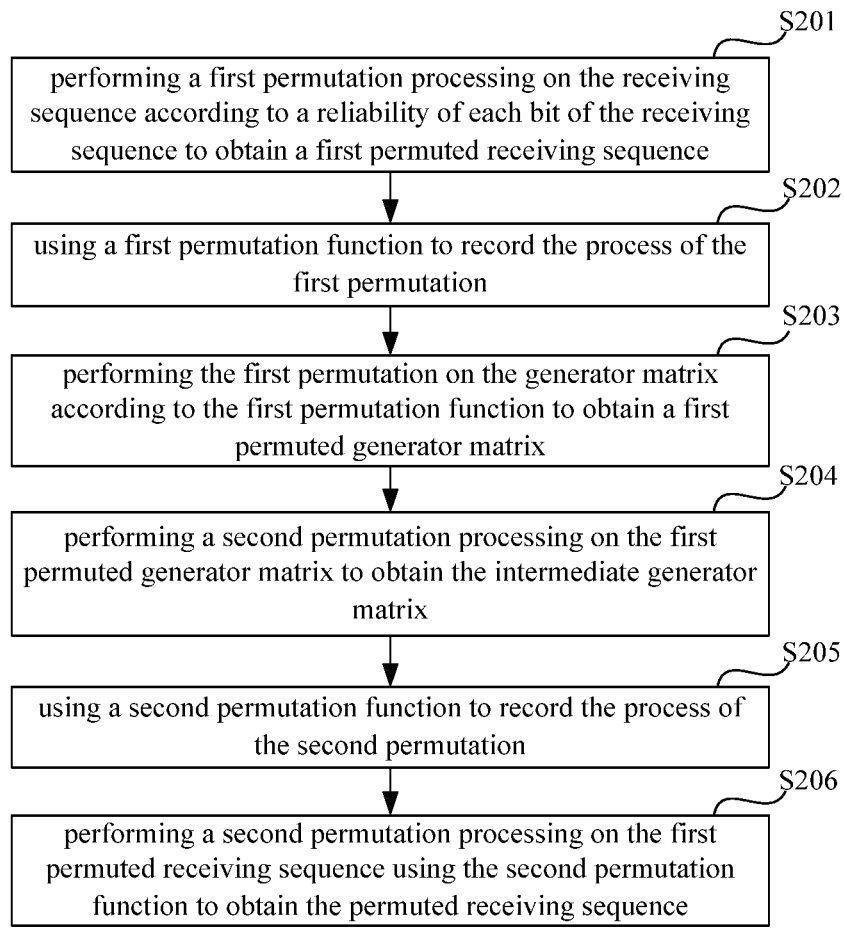
FIG. 2 is a schematic flowchart of a permutation processing according to some examples of the present disclosure.

FIG. 2 is a schematic flowchart of a permutation processing performed on a receiving sequence and a generator matrix to obtain a permuted receiving sequence and an intermediate generator matrix according to some examples of the present disclosure. With reference to FIG. 2, in this example, the permutation processing may include the following steps.

In step S201, performing a first permutation processing on the receiving sequence according to the reliability of each bit of the receiving sequence to obtain a first permuted receiving sequence.

According to some examples of the present disclosure, in the above step S201, during the first permutation processing, bits in the receiving sequence $y_1^N$ are ranked from high to low according to their reliabilities. That is, in the first permutation processing, a bit in the receiving sequence can be transformed from a position i to a position $j_{1i}$. Therefore, in the first permuted receiving sequence $r_1^N$, $|r_1| \geq |r_2| \geq \ldots \geq |r_N|$, wherein $|r_i|$ refers to the reliability of the bit $r_i$. Wherein, N refers to the length of a codeword, that is, the length of the sending sequence In step S202, using a first permutation function to record the process of the first permutation.

Specifically, the first permutation function can be represented as $r_i^N = \lambda_1(y_1^N)$ In step S203, performing the first permutation on the generator matrix according to the first permutation function to obtain a first permuted generator matrix.

According to some examples of the present disclosure, for a generator matrix G, the first permutation processing is performed on column vectors of the generator matrix G using the first permutation function to obtain the first permuted generator matrix G' which can be represented as G'=$\lambda_1$(G). In the first permuted generator matrix, from a left to right order, the column vectors are ranked from high to low on reliability.

In step S204, performing a second permutation processing on the first permuted generator matrix to obtain the intermediate generator matrix.

In this example, in the second permutation, K independent column vectors are searched from a first column on the left of the first permuted generator matrix. These K independent column vectors are used as the first K column vectors of the intermediate generator matrix G". The remaining column vectors of the first permuted generator matrix are used as the remaining N-K column vectors of the intermediate generator matrix G" based on a left to right order. Wherein, K refers to the length of information bits.

In step S205, using a second permutation function to record the process of the second permutation.

Specifically, the second permutation function can be represented as G"$\lambda_2$(G').

In step S206, performing a second permutation processing on the first permuted receiving sequence using the second permutation function to obtain the permuted receiving sequence.

According to some examples of the present disclosure, in the above step 206, the second permutation processing is performed on the first permuted receiving sequence $r_1^N$ using the second permutation function to obtain the permuted receiving sequence $v_1^N$, which can be represented as $v_1^N=\lambda_2(r_1^N)$, where $|v_1|\geq|v_2|\geq \ldots \geq|v_k|$ and $|v_{K+1}|\geq|v_{K+2}|\geq \ldots \geq|v_N|$.

As disclosed in step 206, a Gaussian elimination processing would be performed on the intermediate generator matrix to obtain the systematic generator matrix.

Specifically, according to some examples of the present disclosure, an elementary row transformation is performed on the intermediate generator matrix G″ to performing the Gaussian elimination processing. Then, the first K column vectors of the intermediate generator matrix G″ are transformed into an identity matrix. Thus, the systematic generator matrix $G_1$ after the Gaussian elimination processing can be obtained. In this example, the systematic generator matrix $G_1$ can be represented as $G_1=[I_K P]$. Wherein, $I_K$ denotes an identity matrix; and P denotes a parity matrix.

After that, in the above step S103, the hard-decision decoding is then performed on the first K bits of the permuted receiving sequence $v_1^N$ to obtain the hard-decision decoding sequence $\alpha_1^K$. It can be seen that the first K bits in the permuted receiving sequence $v_1^N$ can be referred to as K independent bits with highest reliabilities.

By means of statistical analysis, the hard-decision decoding sequence $\alpha_1^K$ only includes few error bits, which reduce the number of codewords to be tested compared with other decoding algorithms. Moreover, discarding the remaining N-K bits in the hard-decision decoding processing may not influence the decoding performance significantly.

Figure 3:
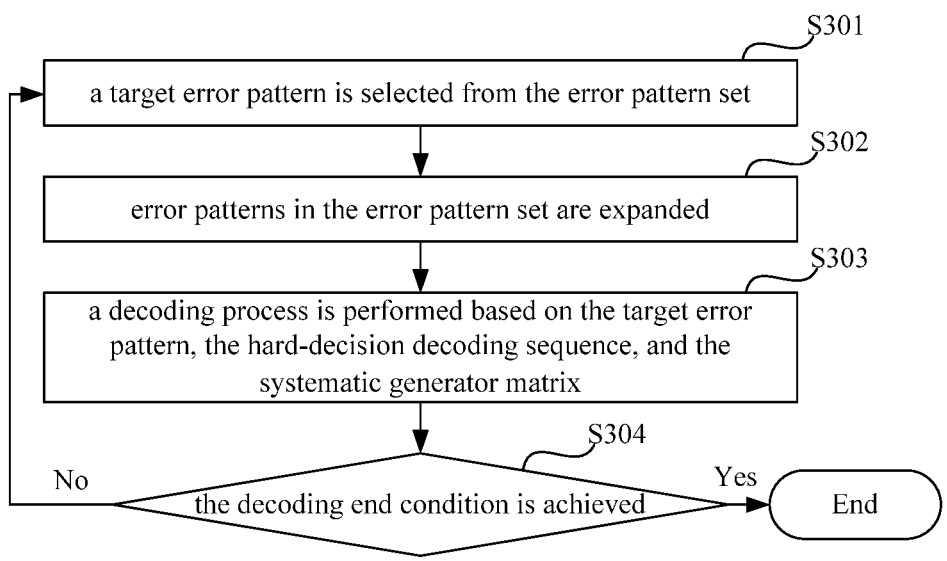
FIG. 3 is a schematic flowchart of a decoding method according to other examples of the present disclosure.

In some other examples of the present disclosure, after a target error pattern is selected, the decoding method may further include the following step: expanding possible error patterns and adding the possible error patterns to the error pattern set to form an updated error pattern set. FIG. 3 is a schematic flowchart of another decoding method according to these examples of the present disclosure.

As shown in FIG. 3, after a target error pattern is selected from the error pattern set in step S301, error patterns in the error pattern set are expanded in step S302 to form an updated error pattern set. Then, in step S303, a decoding process can be performed based on the target error pattern, the hard-decision decoding sequence, and the systematic generator matrix. If the decoding end condition is not achieved, as shown in step S304, return to step S301, in which another target error pattern would be selected from the updated error pattern set. Further, the updated error pattern set may be expanded again to form another updated error pattern set, and a corresponding decoding result may be generated based on the another target error pattern, the hard-decision decoding sequence, and the systematic generator matrix. The above processes of selecting the target error pattern, updating the error pattern set, and decoding would be repeated until the decoding end condition is achieved. After the whole decoding process, a final decoding result would be obtained. In this way, the target error pattern is selected in an orderly manner, such that the decoding complexity can be reduced, and the decoding efficiency can be improved.

In some examples of the present disclosure, the target error pattern may be selected by the following method: for each error pattern in the error pattern set, flipping the hard-decision decoding sequence based on the error pattern to obtain a flipped decoding sequence and calculating a Euclidean distance between the flipped decoding sequence and the permuted receiving sequence on the first K bits; and determining an error pattern with a minimum Euclidean distance as the target error pattern.

In some other examples of the present disclosure, the target error pattern may be selected by the following method: for each error pattern in the error pattern set, flipping the hard-decision decoding sequence based on the error pattern to obtain a flipped decoding sequence, encoding the flipped decoding sequence to obtain an encoded flipped decoding sequence and calculating a Euclidean distance between the encoded flipped decoding sequence and the permuted receiving sequence on the codeword; and determining an error pattern with a minimum Euclidean distance as the target error pattern.

This example provides a method for selecting the target error pattern from the error pattern set. Specifically, for an error pattern $e_1^K$ in the error pattern set, a hard-decision decoding sequence $\alpha_1^K$ is first flipped based on the error pattern $e_1^K$ to obtain a flipped decoding sequence $\alpha_1^K \oplus e_1^K$. Then a Euclidean distance between the flipped decoding sequence and the first K bits $v_1^K$ of the permuted receiving sequence is calculated. The Euclidean distance can be represented as $\|v_1^K-(1_k-2(\alpha_1^K \oplus e_1^K))\|^2$, wherein, $1_k$ refers to that K bits of the sequence are all 1, and 2 represents a demodulation manner being binary phase shift keying (BPSK). After the Euclidean distances corresponding to all error patterns are calculated respectively, an error pattern corresponding to a minimum Euclidean distance is selected as the target error pattern. Moreover, after the target error pattern is selected, the target error pattern would be removed from the error pattern set.

In some examples of the present disclosure, the error pattern set may be generated by expanding from an initial error pattern set. Here, the initial error pattern set may include an initial error pattern. The initial error pattern may be an all-zero sequence with a length of K bits.

In this case, expanding possible error patterns and adding the possible error patterns to the error pattern set may include the following steps.

In response to determining that the error pattern set is the initial error pattern set, a value of a bit with a maximum bit index of the initial error pattern is modified from 0 to 1 to obtain a modified error pattern as a possible error pattern. Then, the modified error pattern is added to the initial error pattern set.

In response to determining that the error pattern set is not the initial error pattern set, a target bit with a value being 1 and a minimum bit index in the target error pattern is searched for. In response to determining that the bit index of the target bit is not 1, a value of a previous bit (a bit with the bit index less than the target bit by 1) of the target bit would be modified from 0 to 1 to obtain a first modified error pattern. Further, based on the first modified error pattern, the value of the target bit would be modified from 1 to 0 to obtain a second modified error pattern. Then, the first modified error pattern and the second modified error pattern are added to the error pattern set.

In this example, while performing a decoding for the first time, a target error pattern is selected from the initial error pattern set. Therefore, the initial error pattern which is the all-zero sequence would be selected as the target error pattern. After that, the initial error pattern would be removed from the error pattern set. Then the initial error pattern may be modified, and the modified error pattern would be added into the error pattern set as an expanded error pattern. When the initial error pattern is modified, a value of a rightmost bit is modified from 0 to 1. And if a left to right order is used, the bit index would be in an ascending order. That is, in the expanded error pattern, a value of a bit with a maximum bit index would be modified to 1.

Each time after the target error pattern is selected, the error pattern set would be expanded to form an updated error pattern set. Therefore, in each subsequent decoding process, a target error pattern would be selected from the updated error pattern set. While expanding the error pattern, the bits with the value of 1 in the target error pattern would be searched at first. If the number of the bits selected is more than 1, a leftmost bit would be selected as the target bit. That is, a bit with the value of 1 and with a minimum bit index would be selected as the target bit. After the target bit is determined, a value of a previous bit (a bit with the bit index less than the target bit by 1) of the target bit is modified from 0 to 1 to obtain a first modified error pattern. Further, based on the first modified error pattern, the value of the target bit would be modified from 1 to 0 to obtain a second modified error pattern. Then the two modified error patterns would be both added to the error pattern set.

In this process, if the target bit is the first bit of the target error pattern, the target error pattern cannot be expanded any more.

In this example, since the bits of a permuted receiving sequence is ranked from high to low based on reliability, when the target error pattern is selected, the error pattern is searched in an inverted order (that is, an order of the reliability from low to high), which can help to find a correct error pattern as soon as possible, therefore, the decoding efficiency can be improved.

In some examples of the present disclosure, the decoding result would be obtained by the following steps.

At first, the hard-decision decoding sequence would be flipped based on the target error pattern to obtain a flipped decoding sequence.

Then, the flipped decoding sequence would be encoded by the systematic generator matrix to obtain a candidate sequence.

Later, two reverse permutations would be performed on the candidate sequence to obtain a permuted candidate sequence.

Moreover, a reverse encoding would be performed on the permuted candidate sequence to obtain the estimated source sequence.

Then, a check would be performed on the estimated source sequence.

In response to the determination the check on the estimated source sequence is passed, the candidate sequence would be modulated to obtain a modulated sequence.

Then, a Euclidean distance between the modulated sequence and the permuted receiving sequence would be calculated.

At last, in response to determining the Euclidean distance is less than a preset minimum Euclidean distance, the permuted candidate sequence or the estimated source sequence can be taken as the decoding result.

Figure 4:
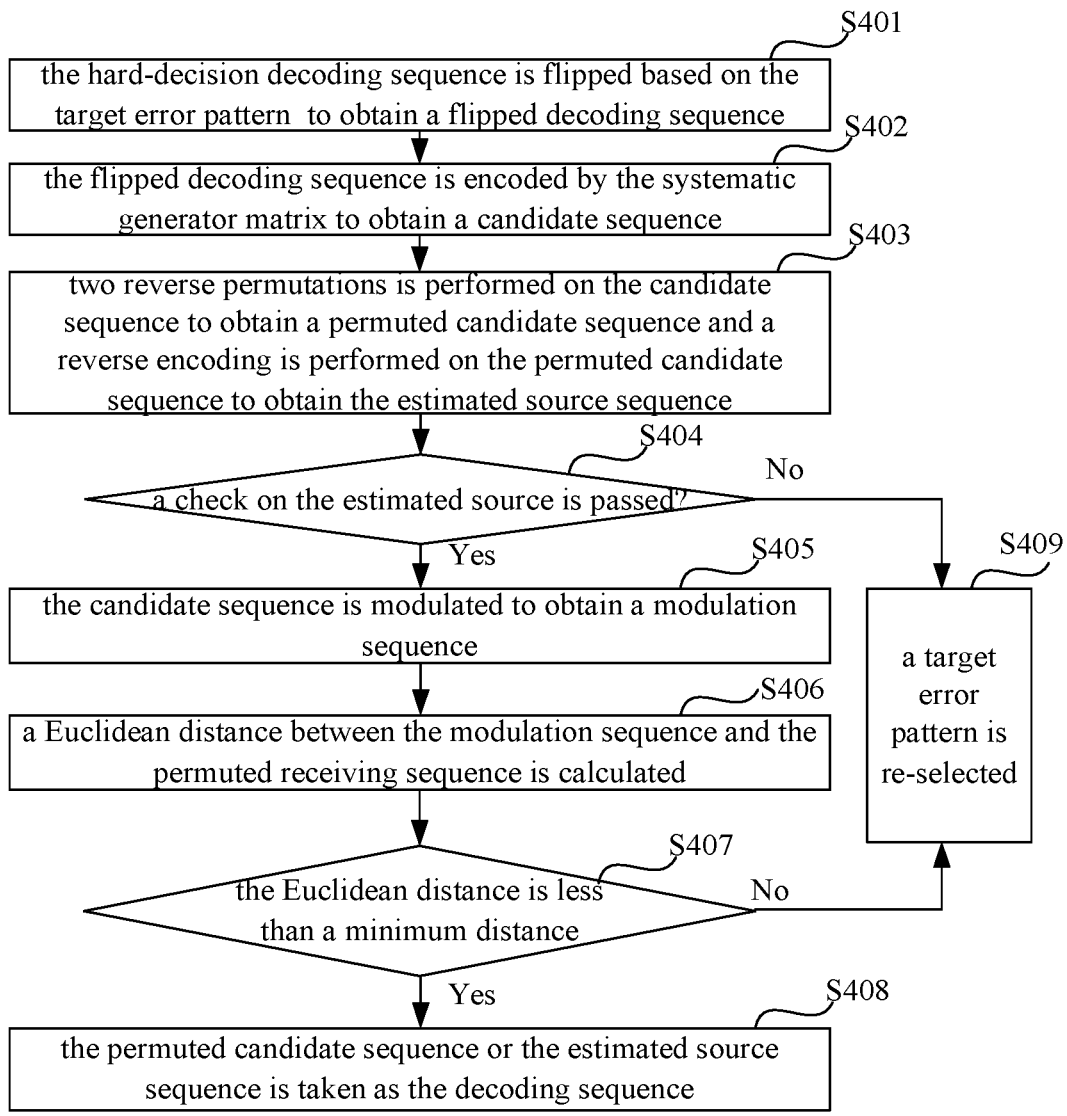
FIG. 4 is a schematic flowchart of generating a decoding result according to some examples of the present disclosure.

FIG. 4 is a schematic flowchart of decoding according to some examples of the present disclosure. As shown in FIG. 4, after a target error pattern is determined, decoding would be performed based on the target error pattern, a hard-decision decoding sequence, and a systematic generator matrix. Specifically, in step S401, the hard-decision decoding sequence $\alpha_1^K$ would be flipped based on the target error pattern $e_1^K$ to obtain a flipped decoding sequence $\hat{C}_1^K = \alpha_1^K \oplus e_1^K$. In step S402, the flipped decoding sequence $\hat{c}_1^K$ would be encoded by the systematic generator matrix $G_1$ to obtain a candidate sequence $\hat{C}_1^N$. In step S403, two reverse permutations would be performed on the candidate sequence to obtain a permuted candidate sequence and a reverse encoding would be performed on the permuted candidate sequence to obtain the estimated source sequence. Then in step S404, whether a check on the estimated source sequence is passed or not is determined. If the check is passed, in step S405, the candidate sequence would be modulated to obtain a modulation sequence $m_1^N$. For example, the candidate sequence would be modulated through BPSK modulation. Then, in step S406, a Euclidean distance $d(m_1^N, v_1^N)$ between the modulation sequence and the permuted receiving sequence $v_1^N$ would be calculated. The Euclidean distance may be represented as $d(m_1^N v_1^N) = \|v_1^N - m_1^N\|2$. And in step S407, if the Euclidean distance is less than a minimum Euclidean distance $d_{min}(m_1^N, v_1^N)$, the permuted candidate sequence or the estimated source sequence would be taken as the decoding sequence $de_1^N$ or $\hat{u}_1^K$ in step S408. Further, the Euclidean distance obtained may be used as an updated minimum Euclidean distance whose initial value could be set as infinite. In this example, during the decoding process, an estimated source sequence would be obtained from the candidate sequence and then a check would be performed on the estimated source sequence. A Euclidean distance would be calculated if the estimated source sequence passes the check, and the Euclidean distance would be judged, such that a more accurate decoding result can be obtained, thereby the decoding performance can be further improved.

In some examples of the present disclosure, the two reverse permutations performed on the candidate sequence may include the following steps. At first, a second reverse permutation would be performed on the candidate sequence using a second reverse permutation function to obtain a first permutated candidate sequence. After that, a first reverse permutation would be performed on the first permutated candidate sequence using a first reverse permutation function to obtain a second permutated candidate sequence, that is, the permuted candidate sequence. In the above method, the first reverse permutation function is a reverse operation function of the first permutation function. Moreover, the second reverse permutation function is a reverse operation function of the second permutation function.

For example, during permutation processing, a bit is transformed from a position i to a position $j_{1i}$ using the first permutation function, and a bit is transformed from the position $j_{1i}$ to a position $j_{2i}$ using the second permutation function. In this case, during the two reverse permutations, the bit would be transformed from the position $j_{2i}$ to the position $j_{1i}$ using the second reverse permutation function, and the bit would be transformed from the position $j_{1i}$ to the position i by using the first reverse permutation function.

In some examples of the present disclosure, a preset decoding end condition may be set as that the decoding times achieves a preset maximum number of decoding times, or the number of decoding results achieves a predetermined number. In a case that the decoding times does not achieve the preset maximum number of decoding times, however the number of decoding results achieves the predetermined number, the preset decoding end condition can be regarded as being achieved. In this case, the decoding result would be regarded as having achieved a preset expectation, therefore the decoding process can be terminated. For example, when the number of decoding results is 2 or 3, the decoding process can be terminated.

In another case, when the decoding times has achieved the preset maximum number of decoding times, however the number of decoding results does not achieve the predetermined number, the preset decoding end condition can also be regarded as being achieved. By limiting the decoding times, the decoding complexity can be reduced. Optionally, the maximum number of decoding times may be set based on the length of the codeword and the length of information bits. The specific value of the maximum number of decoding times should not be limited.

In some examples of the present disclosure, the decoding method may further include the following steps.

In response to determining that the estimated source sequence does not pass the check or the Euclidean distance is larger than the minimum Euclidean distance, the decoding times would be updated.

Moreover, in response to determining that the preset decoding end condition is not achieved, a target error pattern may be re-selected as shown in step S409. Then, a decoding result corresponding to an updated decoding times based on the target error pattern re-selected, the hard-decision decoding sequence, and the systematic generator matrix.

That is, in this example, during a decoding process, if the obtained estimated source sequence does not pass the check, or the calculated Euclidean distance is larger than the minimum Euclidean distance, the target error pattern needs to be re-selected, and the decoding should be performed based on the re-selected target error pattern, the hard-decision decoding sequence, and the systematic generator matrix.

In some examples, cyclic redundancy check (CRC) concatenated polar codes may be adopted as a preset encoding manner. In this case, the method of determining whether the estimated source sequence passes the check may include the following steps. At first, whether the estimated source sequence passes a frozen bit check is determined. Then, whether the estimated source sequence complies with a CRC constraint relationship is checked.

In this example, during the decoding process, the estimated source sequence is checked based on the encoding manner used. For CRC concatenated polar codes, the estimated source sequence may be checked in a frozen bit check manner. Specifically, in addition to K information bits, the remaining N-K bits are frozen bits whose values are 0. During the frozen bit check, whether 1 appears at a position of any frozen bit is judged. If 1 appears at a position of a frozen bit, it is determined that the estimated source sequence does not pass the frozen bit check. Further, whether the estimated source sequence complies with the CRC constraint relationship is judged at the same time. Specifically, CRC check bits would be calculated based on a predetermined method. Then, whether data transmission is correct and complete can be judged through the CRC check bits. If the estimated source sequence passes the frozen bit check and complies with the CRC constraint relationship at the same time, it can be determined that the estimated source sequence passes the check.

In some other examples of the present disclosure, the encoding manner may adopt other linear block codes. In this case, the method of determining whether the estimated source sequence passes the check may include: using a preset check matrix to check the estimated source sequence. That is, at first, the estimated source sequence is multiplied by the preset check matrix. Then a calculation result is checked. In response to determining the calculation result is 0, it is determined that the estimated source sequence passes the check.

According to the decoding method provided by examples of the present disclosure, a decoding process is performed when the decoding end condition is not meet. Moreover, during a decoding process, target error patterns are selected in an orderly manner based on reliability, which can help to obtain a correct code sequence as soon as possible. Therefore, the decoding complexity can be reduced and the decoding efficiency can be improved. At the same time, an estimated source sequence is checked, and a Euclidean distance judgment is further performed on the candidate sequence, such that the decoding accuracy may be improved and the decoding performance can be further improved. To be noted, as described above, the decoding method is applicable to not only short codes, medium-length codes but also long codes.

It should be noted that the decoding method according to one or more examples of the present disclosure may be implemented by a single device, such as a computer or a server. The decoding method may also be applied to a distributed scenario and may be completed by cooperations of a plurality of devices. In a case of the distributed scenario, one of the plurality of devices may merely implement one or more steps in the decoding method, and the plurality of devices may interact with each other to complete the decoding method.

It should be noted that, specific examples of the present disclosure have been described above. Other examples are within the scope of the appended claims. In some cases, the actions or steps recited in the claims can be performed in an order different from that in the examples, and can still achieve desired results. In addition, the processes depicted in the accompanying drawings are not necessarily required to be shown in a particular or sequential order, to achieve desired results. In some implementations, multi-task processing and parallel processing are also possible or may be advantageous.

Figure 5:
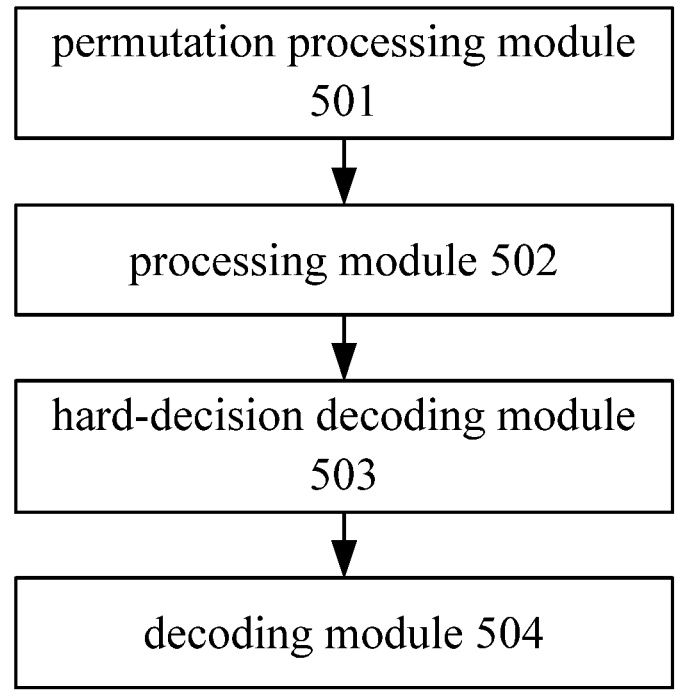
FIG. 5 is a schematic structural diagram of a decoding device according to some examples of the present disclosure.

FIG. 5 is a schematic structural diagram of a decoding device according to some examples of the present disclosure. As shown in FIG. 5, the decoding apparatus may include the following modules.

A permutation processing module 501 is configured to perform a permutation processing on a receiving sequence and a generator matrix to obtain a permuted receiving sequence and an intermediate generator matrix according to a reliability of each bit of the receiving sequence.

A processing module 502 is configured to perform a Gaussian elimination processing on the intermediate generator matrix to obtain a systematic generator matrix generator matrix.

A hard-decision decoding module 503 is configured to perform a hard-decision decoding on the permuted receiving sequence to obtain a hard-decision decoding sequence.

A decoding module 504 is configured to in response to determining a preset decoding end condition is not achieved, select a target error pattern from an error pattern set, and generate a decoding result based on the target error pattern, the hard-decision decoding sequence, and the systematic generator matrix.

For description convenience, the above device is divided into various modules according to the function to be described respectively. Certainly, when one or more examples of the specification are implemented, the function of each module may be achieved in one or more software and/or hardware.

The decoding device of the above examples is used for achieving the corresponding method applied to the foregoing examples and has the beneficial effects of the corresponding method, and the beneficial effects will not be described in detail herein.

Figure 6:
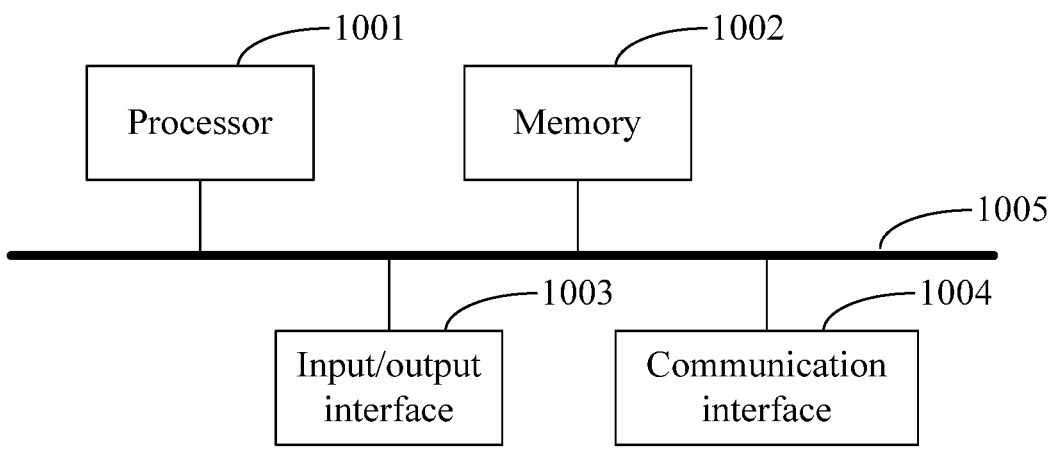
FIG. 6 is a schematic diagram illustration a structure of an electronic device according to an example of the present disclosure.

Based on the above decoding method and the decoding device, the present disclosure also provides an electrical device for implementing the decoding method. FIG. 6 is a schematic diagram illustrating a structure of an electrical device according to an example of the present disclosure.

As shown in FIG. 6, the electronic device may include one or more processors 1001, a memory 1002. In FIG. 6, only one processor 1001 is illustrated. The electronic device may further include an input/output interface 1003, a communication interface 1004, and a bus 1005. The processor 1001, the memory 1002, the input/output interface 1003, and the communication interface 1004 may couple to each other via the bus 1005.

To be noted, a computer program stored in the memory and executable on the processor, wherein the processor executes the program to implement the decoding method.

The processor 1001 may execute the relevant procedures by virtue of a general central processing unit (CPU), a microprocessor, an application specific integrated circuit (ASIC), or one or more integrated circuits, so as to implement the technical solution provided by the examples of the description.

The memory 1002 may be implemented by a read only memory (ROM), a random-access memory (RAM), a static memory device and a dynamic memory device, etc. The memory 1002 may store an operating system and other application procedures. When the technical solution provided by the example of the description is implemented via the software or the hardware, the related procedure codes are stored in the memory 1002 and revoked by the processor 1001.

The I/O interface 1003 is used for connecting an I/O unit to realize information input and output. The I/O unit may be configured in the device (not in the figure) as a component configuration, and may be externally connected to the device to provide the corresponding functions. The input device may include keyboard, mouse, touch screen, microphone and various sensors. The output device may include display, loudspeaker, vibrator and indicator lamp.

A communication interface 1004 is used for connecting a communication unit (not shown in the figure) to realize communication interaction between the device and other devices. The communication unit may realize communication in a wired manner (for example, USB, wire, etc.) or in a wireless manner (for example, mobile network, WIFI, Bluetooth, etc.).

The bus 1005 includes a passage which transmits information among various components (for example, the processor 1001, the memory 1002, the I/O interface 1003 and the communication interface 1004) on the device.

It should be noted that, although the above-mentioned device merely shows the processor 1001, the memory 1002, the I/O interface 1003 and the communication interface 1004 and the bus 1005, the device may further include other components required by the normal operation in the specific implementation process. Besides, those skilled in the art could appreciate that the above-mentioned device may merely include the components required by the solution in the examples of the Description, but not necessarily include all components shown in the figure.

The electronic device according to the foregoing examples is used for implementing the corresponding decoding method in any one of the foregoing examples, and has the beneficial effects of the corresponding method examples, which are not repeated in detail.

The flowcharts and block diagrams in the drawings illustrate the system architecture, functionality, and operation possibly implemented by systems, methods and computer program products according to various examples of the present invention. In this regard, each block in the flowcharts or block diagrams may represent a unit, program segment, or portion of code, which comprises one or more executable instructions for implementing the specified logical function(s). It should be also noted that, in some alternative implementations, the functions noted in the block may occur out of the order noted in the drawings. For example, two blocks shown in succession may, in fact, be executed substantially concurrently, or the blocks may sometimes be executed in the reverse order, depending upon the functionality involved. It should also be also noted that each block and combination of blocks in the flowcharts or block diagrams can be implemented by special purpose hardware-based systems which perform the specified functions or steps, or combinations of special purpose hardware and computer instructions.

The units or units involved in the examples of the present disclosure may be implemented by means of software or programmable hardware. The depicted units or units may be also arranged in the processor, and the titles of these units or units do not constitute the definition thereof in some cases.

Based on the same inventive concept, corresponding to the methods according to any one of the foregoing examples, the present disclosure further provides a non-transitory computer readable storage medium which stores a computer instruction used for enabling the computer to perform the decoding method according to any one of the examples.

The computer readable medium in the example includes volatile, non-volatile, movable and non-movable media, which can realize information storage by any method or technology. The information can be computer readable instruction, data structure, program unit or other data. The example of computer storage media includes, but not limited to phase-change memory (PRAM), static random access memory (SRAM), dynamic random access memory (DRAM), other types of random access memory (RAM), read only memory (ROM), electrically erasable programmable read-only memory (EEPROM), flash memory or other memory technologies, compact disk read only memory (CD-ROM), digital versatile disc (DVD) or other optical memories, cassette magnetic tape, tape, disk memory or other magnetic memory device or any other non-transmission media, and available for storing information accessible by the computing devices.

The computer instruction stored by the storage medium according to the foregoing examples is used for enabling the computer to perform the decoding method according to any one of the examples, and has the beneficial effects of the corresponding method examples, which are not repeated in detail.

Those of ordinary skill in the art should appreciate that the discussion on any one of the foregoing examples is merely exemplary, but is not intended to imply that the scope of the present disclosure (including the claims) is limited to these examples. Under the idea of the present disclosure, the technical features of the foregoing examples or different examples may be combined, the steps may be implemented in any order, and there are many other variations in different aspects of the examples of the present disclosure, all of which are not provided in detail for simplicity.

Besides, for the sake of simplifying description and discussion and not making the examples of the present disclosure difficult to understand, the provided drawings may show or not show the public power supply/earthing connection to an integrated circuit (IC) chip and other parts. Besides, the device may be shown in block diagram form to prevent the examples of the present disclosure from being difficult, and moreover, this considers the following facts, that is, the details of the implementations with regard to the devices in these block diagrams highly depend on the platform which will implement the examples of the present disclosure (that is, these details should be completely within the scope understood by those skilled in the art). Where specific details (e.g., circuits) are set forth in order to describe exemplary examples of the present disclosure, it should be apparent to those skilled in the art that the examples of the present disclosure can be practiced without, or with variation of, these specific details. Therefore, these descriptions shall be considered to be illustrative instead of restrictive thereto.

While the present disclosure has been described in conjunction with specific examples thereof, many alternatives, modifications and variations of such examples will be apparent to those of ordinary skill in the art in light of the foregoing description. For example, other memory architectures, such as dynamic RAM (DRAM), may use the examples discussed.

The examples of the disclosure are intended to embrace all such alternatives, modifications, and variations as to fall within the broad scope of the appended claims. Therefore, any omission, modification, equivalent replacement and improvement made within the spirits and principles of the examples of the present disclosure shall fall within the protection scope of the present disclosure.

What is claimed is:

1. A decoding method, comprising: performing a permutation processing on a receiving sequence and a generator matrix to obtain a permuted receiving sequence and an intermediate generator matrix according to a reliability of each bit of the receiving sequence; performing a Gaussian elimination processing on the intermediate generator matrix to obtain a systematic generator matrix; performing a hard-decision decoding on the permuted receiving sequence to obtain a hard-decision decoding sequence; in response to determining a preset decoding end condition is not achieved, selecting a target error pattern from an error pattern set; and generating a decoding result based on the target error pattern, the hard-decision decoding sequence, and the systematic generator matrix.

2. The method according to claim 1, wherein performing a permutation processing on a receiving sequence and a generator matrix to obtain a permuted receiving sequence and an intermediate generator matrix according to a reliability of each bit of the receiving sequence comprises:
performing a first permutation processing on the receiving sequence according to a reliability of each bit of the receiving sequence to obtain a first permuted receiving sequence;
using a first permutation function to record the process of the first permutation;
performing the first permutation on the generator matrix according to the first permutation function to obtain a first permuted generator matrix;
performing a second permutation processing on the first permuted generator matrix to obtain the intermediate generator matrix;
using a second permutation function to record the process of the second permutation; and
performing a second permutation processing on the first permuted receiving sequence using the second permutation function to obtain the permuted receiving sequence.

3. The method according to claim 2, wherein performing a first permutation processing on the receiving sequence according to a reliability of each bit of the receiving sequence to obtain a first permuted receiving sequence comprises:
ranking the bits of the receiving sequence from high to low according to a reliability of each bit to obtain a first permuted receiving sequence.

4. The method according to claim 2, wherein performing a second permutation processing on the first permuted generator matrix to obtain the intermediate generator matrix comprises:
selecting K independent column vectors from a first column on the left of the first permuted generator matrix; wherein, K refers to a length of information bits;
using the K independent column vectors as first K column vectors of the intermediate generator matrix; and
using remaining column vectors of the first permuted generator matrix as remaining N-K column vectors of the intermediate generator matrix in a left to right order.

5. The method according to claim 1, wherein performing a Gaussian elimination processing on the intermediate generator matrix to obtain the systematic generator matrix comprises:
performing an elementary row transformation on the intermediate generator matrix to performing the Gaussian elimination processing; and transforming the first K column vectors of the intermediate generator matrix into an identity matrix.

6. The method according to claim 1, wherein performing the hard-decision decoding on the permuted receiving sequence to obtain the hard-decision decoding sequence comprises: performing the hard-decision decoding on a first K bits of the permuted receiving sequence to obtain the hard-decision decoding sequence; wherein, K represents a length of information bits.

7. The method according to claim 1, wherein the selecting a target error pattern comprises:
for each error pattern in the error pattern set, flipping the hard-decision decoding sequence based on the error pattern to obtain a flipped decoding sequence, and calculating a Euclidean distance between the flipped decoding sequence and the permuted receiving sequence; and
determining an error pattern with a minimum Euclidean distance as the target error pattern.

8. The method according to claim 1, wherein the selecting a target error pattern comprises:
for each error pattern in the error pattern set, flipping the hard-decision decoding sequence based on the error pattern to obtain a flipped decoding sequence, encoding the flipped decoding sequence to obtain an encoded flipped decoding sequence, and calculating a Euclidean distance between the encoded flipped decoding sequence and the permuted receiving sequence; and
determining an error pattern with a minimum Euclidean distance as the target error pattern.

9. The method according to claim 1, wherein generating a decoding result comprises:
flipping the hard-decision decoding sequence based on the target error pattern to obtain a flipped decoding sequence;
encoding the flipped decoding sequence by the systematic generator matrix to obtain a candidate sequence;
performing two reverse permutations on the candidate sequence to obtain a permuted candidate sequence;
performing a reverse encoding on the permuted candidate sequence to obtain an estimated source sequence;

performing a check on the estimated source sequence;

in response to determining the estimated source sequence passes the check, modulating the candidate sequence to obtain a modulation sequence;

calculating a Euclidean distance between the modulation sequence and the permuted receiving sequence; and in response to determining the Euclidean distance is less than a preset minimum Euclidean distance, taking the permuted candidate sequence or the estimated source sequence as the decoding result.

10. The method according to claim 9, further comprising:

in response to determining the estimated source sequence does not pass the check or the Euclidean distance is larger than the preset minimum Euclidean distance, updating decoding times; and in response to determining the preset decoding end condition is not achieved, re-selecting a target error pattern, and returning to the step of generating a decoding result based on the target error pattern, the hard-decision decoding sequence, and the systematic generator matrix.

11. The method according to claim 9, wherein performing a check on the estimated source sequence comprises:

determining whether the estimated source sequence passes a frozen bit check and whether the estimated source sequence complies with a cyclic redundancy check (CRC) constraint relationship.

12. The method according to claim 9, wherein performing a check on the estimated source sequence comprises:

multiplying the estimated source sequence by a preset check matrix, and determining that the estimated source sequence passes the check if the calculation result is 0.

13. The method according to claim 9, wherein the decoding end condition comprises one of the decoding times achieves a preset maximum number of decoding times or the number of decoding results achieves a predetermined number.

14. The method according to claim 9, wherein performing a reverse permutation processing on the candidate sequence to obtain the decoding result comprises:

performing a second reverse permutation on the candidate sequence using a second reverse permutation function to obtain a first permutated candidate sequence; wherein, the second reverse permutation function is a reverse operation function of the second permutation function;

performing a first reverse permutation on the first permutated candidate sequence using a first reverse permutation function to obtain a second permutated candidate sequence; wherein, the first reverse permutation function is a reverse operation function of the first permutation function.

15. The method according to claim 2, further comprising:

expanding possible error patterns after selecting a target error pattern from an error pattern set; and adding the possible error patterns to the error pattern set to update the error pattern set.

16. The method according to claim 15, wherein expanding possible error patterns comprises:

in response to determining the error pattern set is an initial error pattern set, modifying a value of a bit with a maximum bit index in the initial error pattern to 1 to obtain a first modified error pattern as a possible error pattern; wherein, the initial error pattern set comprises an initial error pattern, and the initial error pattern is an all-zero sequence.

17. The method according to claim 15, wherein expanding possible error patterns comprises:

in response to determining the error pattern set is not the initial error pattern set, searching a target bit with a value being 1 and a minimum bit index in the target error pattern;

in response to determining the bit index of the target bit is not 1, modifying a value of a previous bit of the target bit from 0 to 1 to obtain a possible modified error pattern; and based on the possible modified error pattern, modifying the value of the target bit from 1 to 0 to obtain another possible modified error pattern.

18. An electronic device, comprising a memory, a processor, and a computer program stored in the memory and executable on the processor, wherein the processor executes the computer program to implement the decoding method of claim 1.

19. A non-transitory computer-readable storage medium, wherein the non-transitory computer-readable storage medium stores computer instructions, and the computer instructions are used to make a computer execute the decoding method of claim 1.

* * * * *